US009086561B2

(12) United States Patent
Rostalski et al.

(10) Patent No.: US 9,086,561 B2
(45) Date of Patent: Jul. 21, 2015

(54) OPTICAL ARRANGEMENT IN A PROJECTION OBJECTIVE OF A MICROLITHOGRAPHIC PROJECTION EXPOSURE APPARATUS

(75) Inventors: Hans-Juergen Rostalski, Oberkochen (DE); Tilman Schwertner, Aalen (DE); Alexander Epple, Aalen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 895 days.

(21) Appl. No.: 13/235,651

(22) Filed: Sep. 19, 2011

(65) Prior Publication Data

US 2012/0075602 A1 Mar. 29, 2012

Related U.S. Application Data

(60) Provisional application No. 61/386,168, filed on Sep. 24, 2010.

(30) Foreign Application Priority Data

Sep. 24, 2010 (DE) .......................... 10 2010 041 373

(51) Int. Cl.
*G03B 27/68* (2006.01)
*G03B 27/52* (2006.01)
*G03B 27/60* (2006.01)
*G03B 27/70* (2006.01)
(Continued)

(52) U.S. Cl.
CPC ............ *G02B 17/0663* (2013.01); *G02B 7/182* (2013.01); *G02B 17/061* (2013.01); *G03F 7/70233* (2013.01)

(58) Field of Classification Search
CPC ............ G03F 7/70225; G03F 7/70233; G03F 7/70316; G03F 7/70825; G03F 7/70833; G03F 7/7095; G03F 7/70958; G02B 17/0605; G02B 17/061; G02B 17/0657; G02B 17/0663; G02B 7/182
USPC ........... 355/50, 52, 53, 55, 57, 60, 66, 67–71, 355/77; 359/850, 857–859; 250/492.1, 250/492.2, 492.22, 493.1, 548
See application file for complete search history.

(56) References Cited

U.S. PATENT DOCUMENTS 5,854,713 A * 12/1998 Kuroda et al. ................ 359/850
6,473,243 B1 * 10/2002 Omura .......................... 359/730
(Continued)

FOREIGN PATENT DOCUMENTS

DE 10 2009 045 096 A1 10/2010
DE 10 2010 038 748 A1 3/2011
(Continued)

OTHER PUBLICATIONS

German Office Action, with English translation, for corresponding DE Appl No. 10 2010 041 373.9, dated Jun. 29, 2011.

*Primary Examiner* — Christina Riddle
(74) *Attorney, Agent, or Firm* — Fish & Richardson P.C.

(57) ABSTRACT

The disclosure relates to an optical arrangement in a projection objective of a microlithographic projection exposure apparatus which is designed for operation in EUV. The optical arrangement includes first and second mirrors that are in direct succession to each other along the projection beam direction. The second mirror is rigidly connected to the first mirror.

17 Claims, 5 Drawing Sheets

(51) Int. Cl.
  *G02B 17/06*    (2006.01)
  *G02B 7/182*    (2006.01)
  *G03F 7/20*     (2006.01)
  *G03B 27/54*    (2006.01)

(56) References Cited

U.S. PATENT DOCUMENTS

| | | | |
|---|---|---|---|
| 6,485,153 B2 * | 11/2002 | Ota | 359/859 |
| 6,757,051 B2 * | 6/2004 | Takahashi et al. | 355/67 |
| 6,970,228 B1 * | 11/2005 | Aoki et al. | 355/30 |
| 7,330,236 B2 * | 2/2008 | Hasegawa | 355/30 |
| 2001/0038446 A1 * | 11/2001 | Takahashi | 355/67 |
| 2002/0044260 A1 * | 4/2002 | Takahashi et al. | 353/31 |
| 2006/0181689 A1 | 8/2006 | Phillips et al. | |
| 2009/0122428 A1 | 5/2009 | Phillips et al. | |
| 2010/0091941 A1 * | 4/2010 | Zocchi et al. | 378/34 |
| 2012/0224186 A1 * | 9/2012 | Hetzler et al. | 356/508 |

FOREIGN PATENT DOCUMENTS

| | | |
|---|---|---|
| WO | WO 2005/054953 A2 | 6/2005 |
| WO | WO 2010028748 A1 * | 3/2010 |
| WO | WO 2011/020690 A2 | 2/2011 |
| WO | WO 2011/039103 A1 | 4/2011 |

* cited by examiner $D_{opt}$/thickness

OPTICAL ARRANGEMENT IN A PROJECTION OBJECTIVE OF A MICROLITHOGRAPHIC PROJECTION EXPOSURE APPARATUS

CROSS REFERENCE TO RELATED APPLICATIONS

This application claims benefit under 35 USC 119 of German Patent Application 10 2010 041 373.9, filed on Sep. 24, 2010, and priority under 35 USC 119(e) to U.S. Patent Application 61/386,168, filed on Sep. 24, 2010. The entire content of both of these applications are hereby incorporated herein by reference.

FIELD

The disclosure relates to optical arrangement in a projection objective of a microlithographic projection exposure apparatus.

BACKGROUND

Microlithography is used for the production of microstructured components such as for example integrated circuits or LCDs. The microlithography process is carried out in a so-called projection exposure apparatus having an illumination system and a projection objective. In that case the image of a mask (=reticle) illuminated by the illumination system is projected by the projection objective onto a substrate (for example a silicon wafer) which is coated with a light-sensitive layer (photoresist) and arranged in the image plane of the projection objective to transfer the mask structure onto the light-sensitive coating on the substrate.

Mirrors are used as optical components for the imaging process in projection objectives designed for the EUV range (wavelengths of for example about 13 nm or about 7 nm) due to the lack of availability of suitable translucent refractive materials. Particularly in high-aperture projection objectives (for example with values of the numerical aperture of greater than 0.4) a small spacing (for example in the range of 20-50 mm) is used between the mirror arranged most closely to the wafer and the wafer, which in turn involves a comparatively thin mirror (for example the ratio of maximum diameter to maximum thickness, with respect to the surface which is optically used or acted upon light, can be 10 or more).

With thin mirrors of that kind, the increase in mirror dimensions (involved with increasing numerical apertures) to comply with desired specifications makes it desirable to use increasing natural frequencies to rigidly maintain the positions of the optical elements relative to each other even when external vibrations occur while also providing adequate stiffness with respect to parasitic and mass-dependent moments or interference forces (generally produced by screwing of the mirrors after polishing).

Approaches for resolving issues related to applying mechanical stresses to optical elements such as mirrors or lenses are known, for example, from WO 2005/054953 A2 or US 2009/0122428 A1.

SUMMARY

The disclosure provides an optical arrangement in a projection objective of a microlithographic projection exposure apparatus, which reduces or avoids adverse effects on the imaging properties due to parasitic moments or forces occurring at the optical elements even in the case of higher numerical apertures.

In one aspect, the disclosure provides an optical arrangement in a projection objective of a microlithographic projection exposure apparatus which is designed for operation in EUV includes a first mirror and at least one second mirror. The first mirror and the second mirror are in direct succession to each other along the projection beam direction. The second mirror is rigidly connected to the first mirror.

The term rigid connection is used herein to denote connections which are non-releasable—that is to say which involve a positively locking connection or a connection involving intimate joining of the materials involved—, and also connections which are releasable—being therefore in force-locking relationship.

The disclosure involves in particular a departure from the conventional approach of coupling all mirrors to a carrier structure for example by way of Lorentz or piezoelectric actuators and without a rigid solid-body connection. A mirror (in particular the last at the wafer side) can be provided that is sufficiently thin and nonetheless has adequate stiffness, in the arrangement according to the disclosure. In that regard, with the approach according to the disclosure, a reduction in the number of degrees of freedom available overall for actuation (for example for the purposes of correcting aberration phenomena) is deliberately accepted, which results from the fact that, with a rigid connection between two mirrors, instead of 12 degrees of freedom, only 6 degrees of freedom are still available (with respect to displacements in the three spatial directions x, y and z and with respect to rotary movements $R_x$, $R_y$ and $R_z$ about the corresponding axes).

In some embodiments, the first and second mirrors can be monolithic or can be made from one and the same block of material (for example a glass ceramic material), wherein the monolithic configuration means that the use of any connecting procedures or joining procedures using for example adhesives, chemicals, clamping connections and so forth is unnecessary and the applications of stress that these entail are avoided. Suitable materials for the first and second mirrors are for example quartz glass ($SiO_2$) or glass ceramic materials, in particular those with an extremely low coefficient of expansion such as for example titanium silicate glass (for example under the trade mark name ULE®) or the glass ceramic materials marketed under the trade mark names Zerodur® and Clearceram®.

Consequently the shrinkage or stressing effects which are also involved with adhesive joints and hardening thereof and also instabilities in respect of the connection under vacuum conditions can also be avoided. The increased complication and expenditure in terms of production engineering, which can be involved with a monolithic configuration for the mirrors, is deliberately accepted in order as the counterpart to reduce parasitic moments or forces and to take account of the stiffness to be achieved in spite of large mirror diameters or small mirror thicknesses.

The disclosure however is not restricted to the monolithic configuration of the two mirrors. Rather, embodiments in which the rigid connection between the first and second mirrors is made by one or more interposed components should also be deemed to be embraced by the present disclosure.

In some embodiments, the first mirror and the second mirror are connected together by way of at least one ring. The ring is preferably made from the same material as the first and second mirrors, to avoid stress effects. In particular the ring can be made from a glass ceramic material such as for example titanium silicate glass (for example under the trade mark name ULE®) or the glass ceramic materials marketed under the trade mark names Zerodur® and Clearceram®.

In some embodiments, the ring has at least one opening, whereby access to the internal space is simplified while also making it possible to save on material.

In some embodiments, the optical arrangement has a natural frequency which is greater by 20%, in particular 40%, further particularly by 60%, than the lowest natural frequency of a corresponding arrangement without a rigid connection between the first and second mirrors.

The magnitude of the natural frequency depends on the regulator frequency. A typical regulator frequency (without the disclosure being restricted thereto) can be for example 200 Hz. Then preferred values of the natural frequency are at least five times that value, that is to say at least 1000 Hz.

On the assumption that all components include the same material, in general, the natural frequency can only be increased by increasing the area moment of inertia of the arrangement. In some embodiments, the optical arrangement has an area moment of inertia which is greater by 40%, in particular 100%, further particularly 160%, than the area moment of inertia of a corresponding arrangement without a rigid connection between the first and second mirrors, wherein those values arise out of the above-indicated description relating to the natural frequency and the relationship also specified hereinafter between stiffness and natural frequency (see equation (2) below).

In some embodiments, the optical element has a ratio of maximum diameter to maximum thickness of at least 10, such as at least 15 or at least 20 (wherein the diameter is related in each case to the area which is optically used or acted upon by light). With such small thicknesses the disclosure is particularly advantageous insofar as the stiffness which can be achieved according to the disclosure with small thicknesses is particularly useful.

The disclosure also provides a projection objective and also a microlithographic projection exposure apparatus for EUV lithography having an illumination system and a projection objective, wherein the illumination system and/or projection objective have an optical arrangement according to the disclosure with above-described features.

In some embodiments, the second mirror can be the mirror of the projection objective that is arranged geometrically closest to the wafer. In addition the projection objective can have a numerical aperture of at least 0.3 (at least 0.4, at least 0.45, at least 0.5). In such situations the disclosure is particularly advantageous insofar as (as discussed in the opening part of this specification) it is precisely in the case of comparatively high numerical apertures (with respect to the small spacing between the mirror that is last at the image plane side and the wafer) that it is particularly useful that the mirror is comparatively thin so that the stiffness which can be achieved in accordance with the disclosure with small thicknesses.

The microlithographic projection exposure apparatus can be designed in particular for a working wavelength of less than 15 nm.

Further configurations of the disclosure are to be found in the description and the appendant claims.

The disclosure is described in greater detail hereinafter via embodiments by way of example illustrated in the accompanying Figures.

DETAILED DESCRIPTION OF PREFERRED EMBODIMENTS

Figure 1:
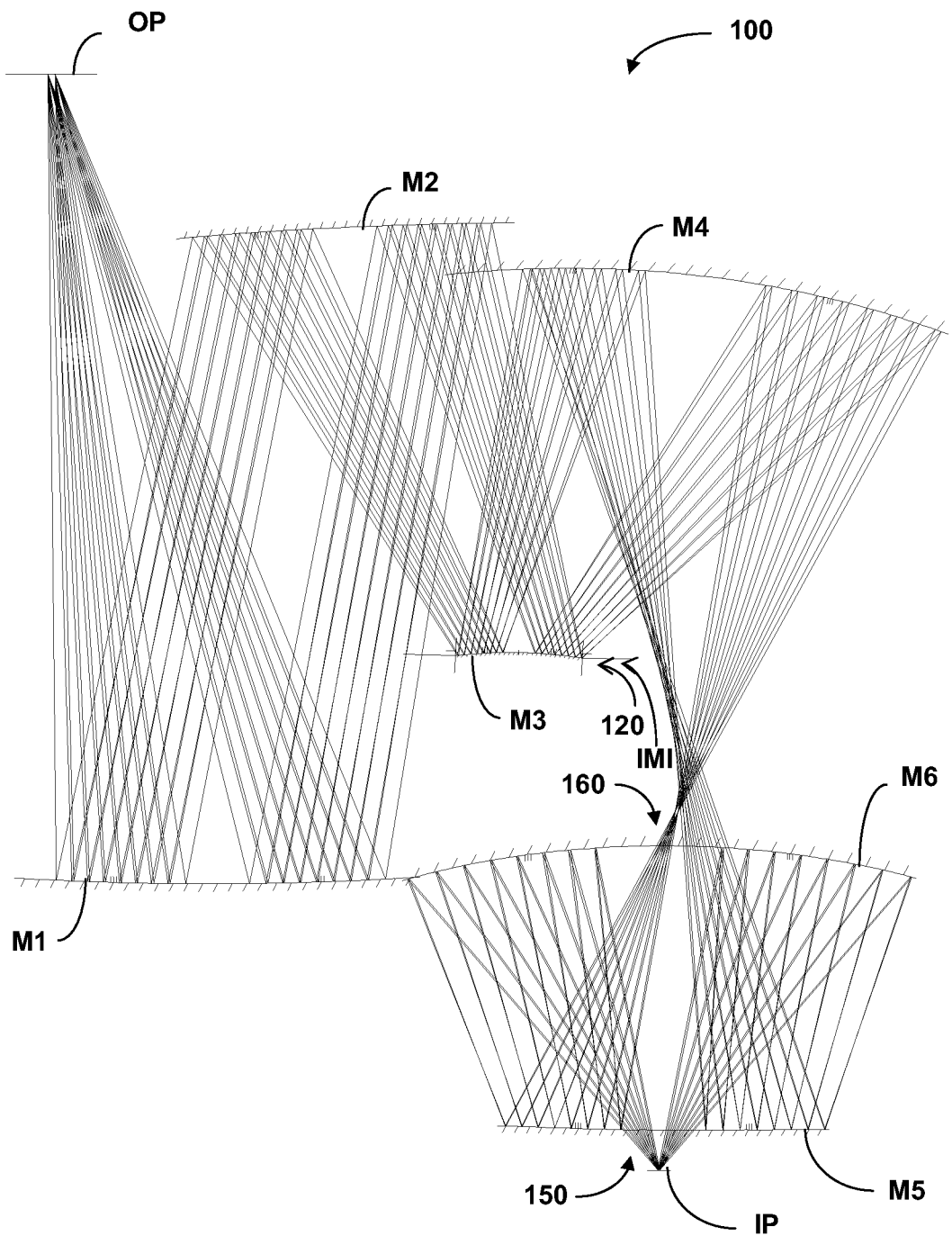
FIG. 1 shows an embodiment of a projection objective of a microlithographic projection installation designed for EUV, in which the disclosure can be carried into effect.

FIG. 1 shows an embodiment of a projection objective of a lithographic projection exposure apparatus which is designed for operation in EUV and in which the present disclosure can be used. The design data of the projection objective 100 are set forth in Tables 1 and 2.

For the projection objective 100, for each of a total of six mirrors M1 through M6, the "thickness" in Table 1 denotes in the usual manner the spacing (in units of mm) from a respective reflecting surface to the next surface. The radius is also specified (in units of mm) for each of the mirrors M1 through M6. "DCY" denotes the decentering in the y-direction (in units of mm) for each mirror M1 through M6 and "TLA" denotes the tilt about the x-axis (in units of °). The description of the free form surfaces of each of the six mirrors M1 through M6 follows in the usual fashion from equation (1), wherein the coefficients of the polynomial forming the second term of equation (1) are set forth in Table 2.

$$p(x,y) = \frac{\rho_x x^2 + \rho_y y^2}{1 - \sqrt{1 - (1+k_x)(\rho_x x)^2 - (1+k_y)(\rho_y y)^2}} + \sum_{i,j=0}^{i+j \leq n} XiYj \cdot x^i y^j \quad (1)$$

x and y respectively identify the positional coordinates in the mirror plane, p(x, y) denote the camber, $\rho_x=1/RDX$ and $\rho_y=1/RDY$ respectively denote the curvatures in the x- and y-directions respectively, and $k_x$ and $k_y$ respectively denote conical constants.

The projection objective 100 has an intermediate image plane IMI and a pupil plane with an obscuration aperture 120 arranged therein. The projection objective 100 includes a total of six mirrors M1-M6, wherein M5 denotes the mirror which is arranged closest to the wafer or the image plane IP and which has a through hole 150. M6 denotes the mirror which is last in relation to the optical beam path and which has a through hole 160. A beam from the object field or reticle arranged in the object plane OP passes to a wafer arranged in the image plane IP after reflection at the mirrors M1-M6 to produce an image of the structure of the reticle that is to be imaged.

The two mirrors M5 and M6 which are last in relation to the optical beam path can be designed in accordance with the embodiments described hereinafter with reference to FIGS. 3-5. These mirrors are in direct succession to each other along the projection beam direction. The configuration according to the disclosure in particular of those mirrors M5, M6 is advantageous in regard to the small structural space available at the position of the mirror M5. The disclosure however is not restricted to the two mirrors which are last in the optical beam path but in principle can also be used in relation to other mirrors in the projection objective 100 or also in the illumination system (not shown).

Figure 2:
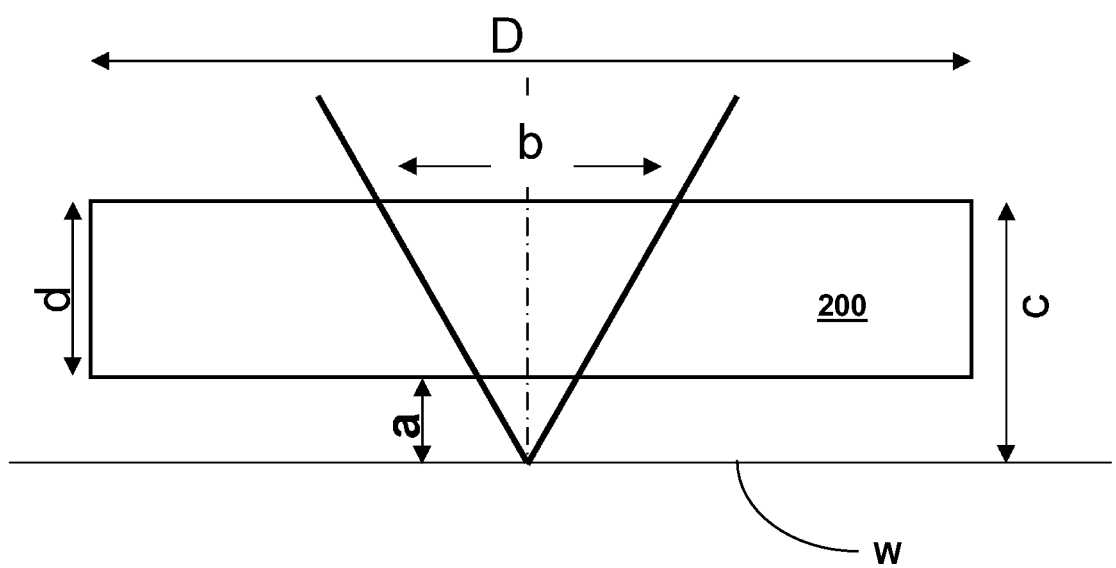
FIG. 2 shows a diagrammatic view to illustrate an underlying issue addressed by the present disclosure.

FIG. 2 shows a diagrammatic view to illustrate the underlying issue addressed by the disclosure. In particular, with a high aperture at the projection objective (for example with values NA>0.4) a small spacing is to be observed between the mirror arranged closest to the wafer (that is to say the mirror M5 in FIG. 1) and the mirror, which in turn involves the mirror being comparatively thin, while on the other hand also ensuring adequate stability for the mirror for example during manufacture and in operation.

The diagrammatic view in FIG. 2 shows a mirror 200 by way of example (approximately corresponding to the mirror M5 in FIG. 1) involving a diameter of D=400 mm in a system with a numerical aperture NA=0.5 so that, at a distance of c=104 mm, that gives a diameter of the opening in the mirror 200 of b=120 mm. For the sake of simplicity FIG. 2 only assumes imaging of a single object or field point (in that respect in reality an extended object field is imaged). To guarantee adequate stability during manufacture and also the provision of adequate natural frequencies the thickness of the mirror 200 should be at least 80 mm, that is to say, it should not exceed a ratio of diameter to thickness (=D/d) of 5. In the specific case therefore all that still remains is a free spacing a of 24 mm between the underside of the mirror 200 and the wafer W. In comparison, an increase in the free spacing a is desirable. Simple displacement of the mirror is generally not desired because of the increase in obscuration that involves. Accordingly an increase in a could be achieved only by way of a reduction in the thickness d. That now leads to the problem that an adequate natural frequency or sufficient stiffness is no longer readily attained.

Figure 7:
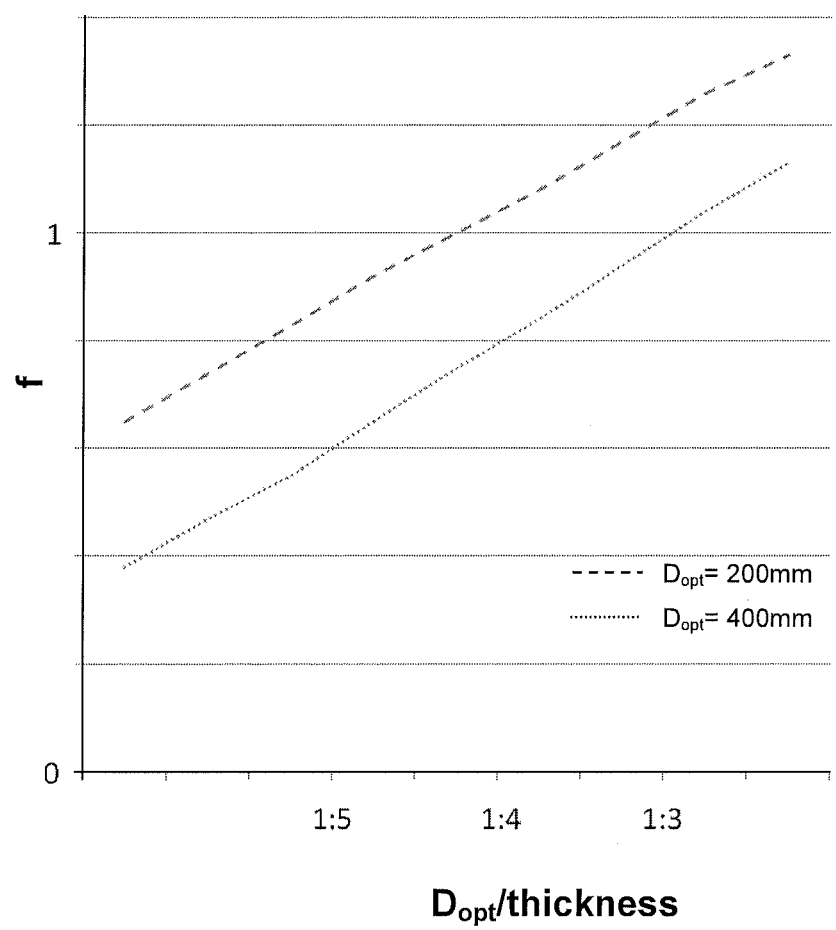
FIG. 7 shows a relationship by way of example between natural frequency and thickness of a mirror for different values of the effective mirror diameter $D_{opt}$.

The relationship between natural frequency and thickness of the mirror is shown by way of example in FIG. 7, based on two different values for the optically effective mirror diameter $D_{opt}$ (of $D_{opt}$=200 mm or $D_{opt}$=400 mm). The natural frequency is shown here standardized to a minimum value to be achieved. It will be seen that it is only with an increasing thickness D or greater values with respect to the ratio of diameter $D_{opt}$ to thickness, that this gives greater values for the natural frequency f.

The relationship between stiffness k (in units N/m) and natural frequency f of a mass-spring oscillator is given by $$f = \frac{1}{2 \cdot \pi} \sqrt{\frac{k}{m}} \quad (2)$$

wherein m denotes the mass coupled by way of the spring.

Figure 3:
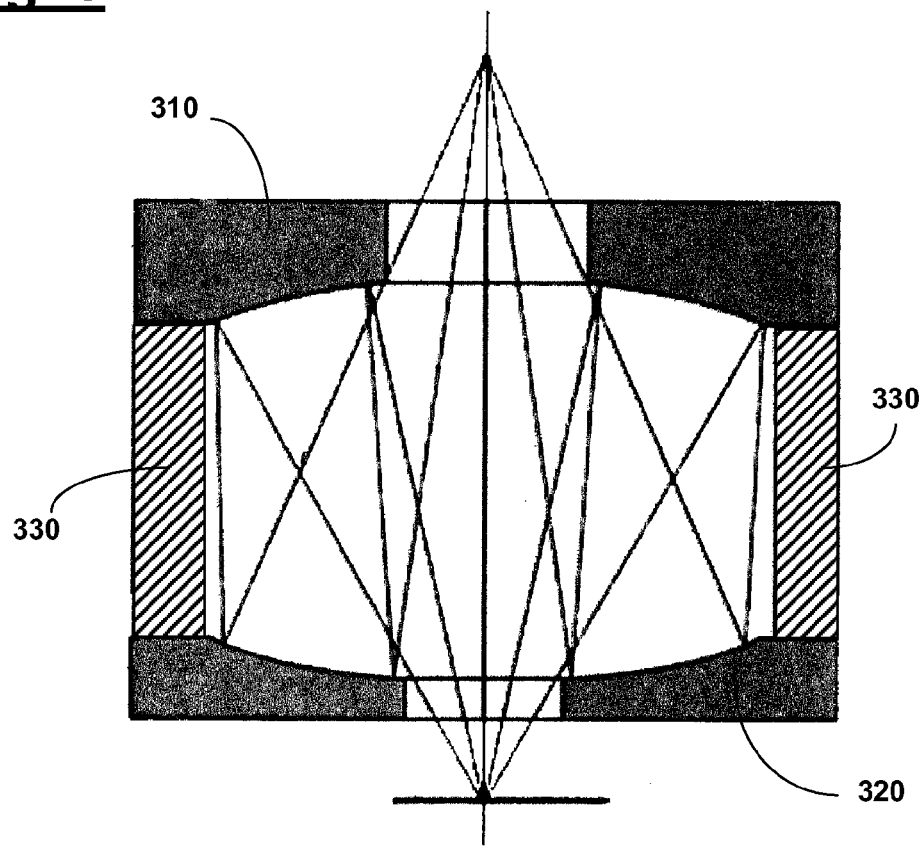
FIG. 3 shows a diagrammatic view to describe the disclosure.

FIG. 3 firstly shows a diagrammatic view to describe the disclosure.

The underlying concept involves a rigid connection between two mirrors 310 and 320, which can be effected by way of a ring 330 as diagrammatically shown in FIG. 3. The arrangement formed as shown in FIG. 3 should have adequate stiffness so that it behaves substantially like a rigid body, wherein the natural frequency of the overall arrangement should be greater than 1200 Hz, preferably greater than 1400 Hz, further preferably greater than 1500 Hz.

Figure 4:
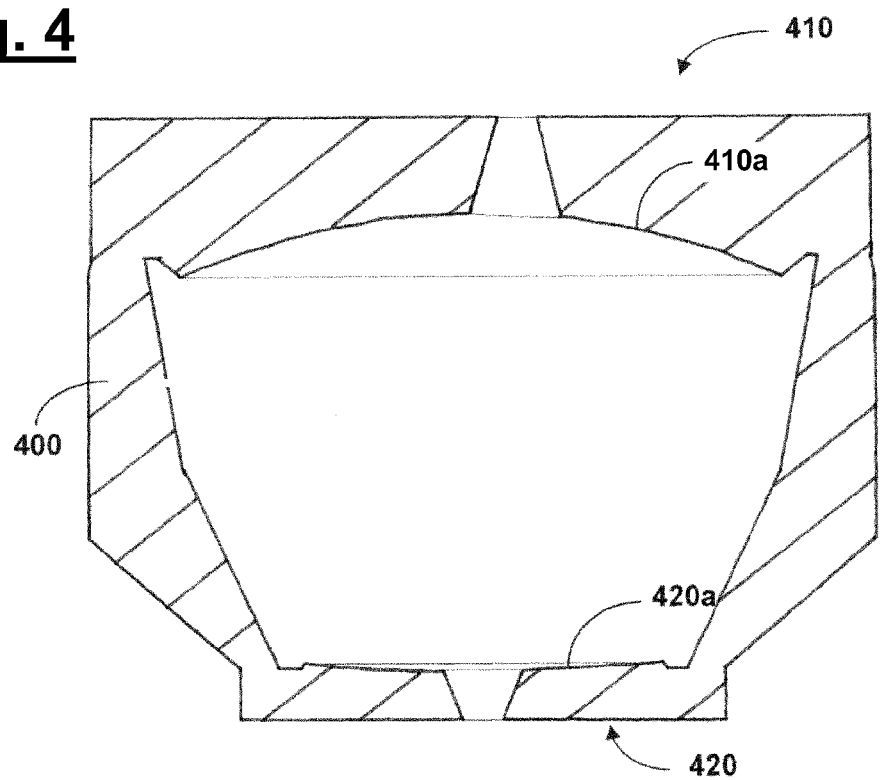
FIGS. 4-6 show different views to explain different embodiments of the disclosure.

In an embodiment diagrammatically shown in FIG. 4 the above-mentioned "ring" 330 can be afforded by the mirror group formed by two mirrors having mirror surfaces 410a and 420b being of a monolithic configuration, that is to say made from a single block of material. In FIG. 4 the remaining "combined" mirror is denoted by 400.

In a specific embodiment, taking FIG. 4 as the basic starting point, for the first mirror 410 the optically free diameter of the mirror surface 410a can be 630 mm and the thickness can be 150 mm, and for the second mirror 420 the optically free diameter of the mirror surface 420a can be 370 mm and the thickness 60 mm. In that case that gives a natural frequency of 0.9 kHz for the first mirror 410 and a natural frequency of 1 kHz for the second mirror 420, in each case for the situation where they do not involve the rigid connection to each other according to the disclosure. Using the monolithic configuration shown in FIG. 4, those natural frequencies (achieved for the individual mirrors) can be increased to 1600 Hz for the monolithic assembly or the "combined" mirror 400.

In a further approach, the rigid connection according to the disclosure can provide that the area moment of inertia is increased by the factor of 1.4, in particular 2.6, in comparison with a similar assembly without a rigid connection.

Figure 5:
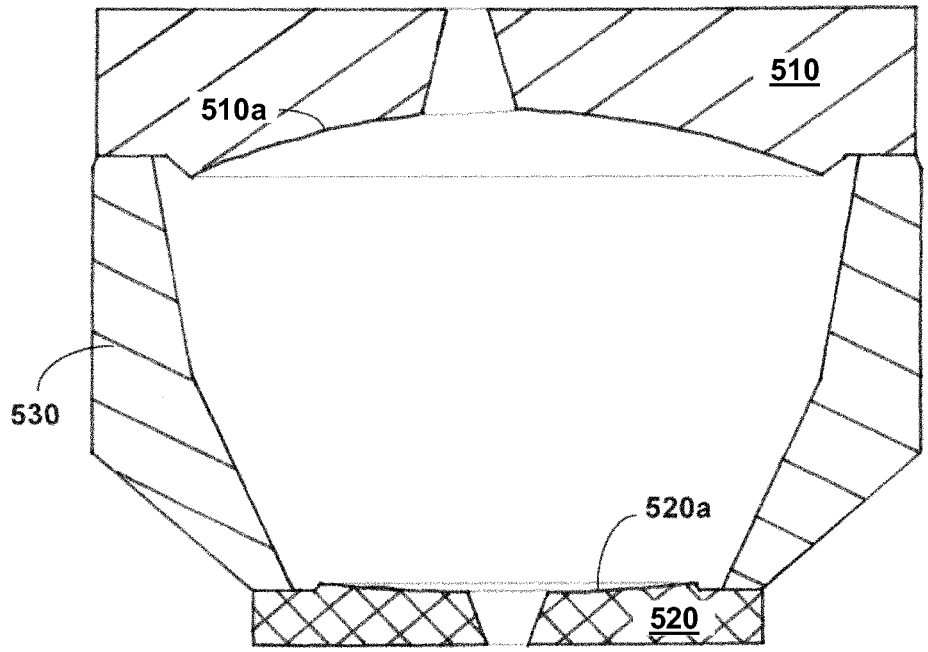

In a further embodiment diagrammatically shown in FIG. 5 a ring 530 can be mechanically coupled to two mirrors 510 and 520 by way of joining connections. The joining connections can be effected in the form of adhesive connections or also by being wrung together, in which case wrung connections provide that the problems typically involved with an adhesive connection such as ageing or shrinkage effects can be avoided. The ring 530 is made from the same material as the two mirrors 510, 520, for example a glass material with a low coefficient of thermal expansion such as quartz glass ($SiO_2$) or the above-mentioned glass ceramic materials. The ring 530 can include two or also more components or ring portions, which is advantageous in particular in regard to production aspects. Those parts can also each be designed monolithically with only one of the mirrors 510, 520, while moreover joining connections can be produced for example between two ring portions, between a respective ring portion and a mirror 310, 320 and so forth.

In further embodiments the ring 530 can have openings (not shown) in order on the one hand to simplify access to the internal space and on the other hand also to achieve a saving of material.

Figure 6:
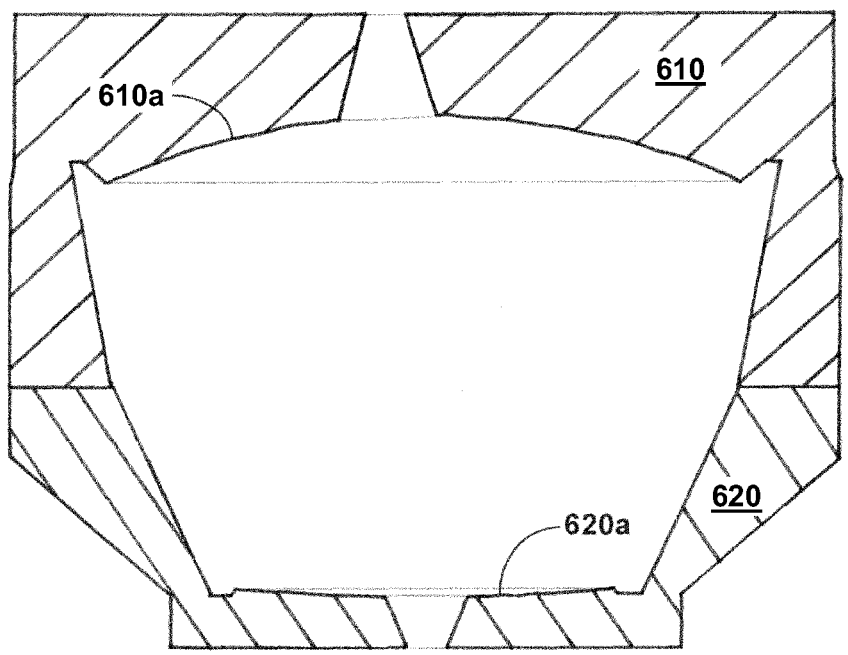

In a further embodiment diagrammatically shown in FIG. 6 the two mirrors 610, 620 can also be connected directly to each other by way of joining connections (in the form of adhesive connections or also by being wrung together). In this embodiment so-to-speak the ring 330 of FIG. 3 is replaced by two ring portions or partial rings, wherein each of those ring portions is formed monolithically with a respective one of the mirrors.

Although the embodiments show a substantially round mirror the disclosure is not restricted thereto. Rather, the mirror in this and in the other embodiments can also be of any other geometry, for example elliptical, rectangular, reniform or triangular. It will be appreciated moreover that the dimensionings shown in FIG. 6 for the mirrors 610, 620 or the ring portions formed monolithically therewith are only by way of example so that a larger or smaller portion of the ring can also be associated with the first or second mirror 610, 620 respectively. In principle it is desirable if the larger ring portion is associated with the mirror 620 which is the lower mirror in FIG. 6 (corresponding therefore to the mirror M5 in FIG. 1) as it is precisely that mirror 620 or M5 that is limited in its thickness by virtue of its being arranged immediately in front of the wafer plane and thus an increase in stiffness is particularly relevant. In the extreme case substantially the entire ring can be formed monolithically on the mirror 620 or M5 so that the mirror 610 or M6 so-to-speak only forms the "lid" of the "can-shaped" assembly produced overall in that way.

In further embodiments the ring 330 of FIG. 3 can also be replaced by ring portions of another geometry.

Actuation of the mirrors rigidly connected together in the above-described embodiments can be effected on the basis of conventional Lorentz or voice coil or piezoelectric actuators, in which case account is to be taken of the problems arising due to the rigid connection.

An advantage of this arrangement is that the fixings of the actuators can now be made on an overall stiffer part so that an arrangement for example at the less stiff last mirror in front of the wafer is no longer required. In that way fewer aberration phenomena are generated upon actuation.

The disclosure also relates to an optical arrangement in a projection objective of a microlithographic projection exposure apparatus which is designed for operation in EUV, including a first mirror and at least one second mirror, wherein the first mirror and the second mirror (or their reflecting surfaces, respectively) are arranged in a hollow body (or forming a hollow body), as e.g. shown in the above-discussed FIGS. 3 to 6.

The embodiments of FIGS. 5 and 6 are also advantageous in so far as the connection of the components forming the hollow body (wherein this connection can e.g. be realized by a ring) with that mirror is spaced from the reflecting surfaces in the axial/and or radial direction, so that transferring of mechanical stresses to the reflecting surfaces is avoided or at least substantially reduced. More particularly, according to FIG. 5, this spacing is realized in the radial direction (relative to the optical axis running vertically in the drawing, i.e. the light propagation direction) and due to the collar shown in the outer periphery of the reflecting surfaces of the mirrors 510, 520). In the embodiment shown in FIG. 6 such collars in the outer periphery of the reflecting surfaces of the mirrors are also provided and effect a spacing of the connection of the mirrors 610, 620 (or the mirror substrate, respectively) from the reflecting surfaces in the axial direction (relative to the optical axis running vertically in the drawing). Accordingly, in embodiments of the disclosure, for at least one mirror of the two mirrors, the connection of the components forming the hollow body (wherein this connection can e.g. be realized by a ring) is spaced from the reflecting surface of that mirror in the axial and/or radial direction (relative to the optical axis running vertically in the drawing, i.e. the light propagation direction), so that transferring of mechanical stresses to the reflecting surfaces is avoided or at least substantially reduced.

The first mirror and the second mirror can be connected together by way of at least one ring. This ring can be made from the same material as the first and second mirror. According to an embodiment, the ring is made from a glass ceramic material.

According to an embodiment, the ring is mechanically coupled to the first and second mirror by way of joining connections. The ring can also include at least two parts, each of those parts being designed monolithically with only one of the mirrors.

According to an embodiment, the two mirrors are connected directly to each other by way of joining connections.

Furthermore, according to an embodiment, the components forming the hollow body are connected to each other without transferring mechanical stress to the reflecting surfaces of the first mirror and the second mirror.

Even if the disclosure has been described by reference to specific embodiments numerous variations and alternative embodiments will be apparent to the man skilled in the art, for example by combination and/or exchange of features of individual embodiments. Accordingly it will be appreciated by the man skilled in the art that such variations and alternative embodiments are also embraced by the present disclosure and the scope of the disclosure is limited only in the sense of the accompanying claims and equivalents thereof.

TABLE 1

| (Design data in relation to FIG. 1; NA = 0.5; OBH = 52.15 mm, λ = 13.5 nm) | | | | |
| --- | --- | --- | --- | --- |
| SURFACE | THICKNESS | RADIUS | DCY | TLA [°] |
| 0 | 1387.319174 | 52.2 | 0 | 0 |
| 1 | −1104.037851 | 239.7 | 190.447577 | 0.069740 |
| 2 | 724.028907 | 195.3 | 336.820796 | 3.976293 |
| 3 | −646.484917 | 78.0 | 537.456587 | −1.796819 |
| 4 | 1450.744752 | 263.4 | 750.806148 | −10.111627 |
| 5 | −487.122036 | 192.9 | 704.607383 | −0.899538 |
| 6 | 556.226247 | 293.6 | 699.395679 | 0.318002 |
| 7 | 0.000000 | 13.0 | 699.345803 | 0.000000 |

TABLE 2

| (Free form coefficients in relation to FIG. 1) | | | | | | |
| --- | --- | --- | --- | --- | --- | --- |
| Surface | 1 | 2 | 3 | 4 | 5 | 6 |
| RDY | −2.45307E+03 | 2.71446E+03 | 3.32855E+02 | 9.23959E+02 | −3.72436E+03 | 7.86520E+02 |
| KY | −7.59818E+00 | 1.00011E+01 | 4.44283E+00 | 8.42372E−01 | −9.98414E+00 | −8.15921E−01 |
| RDX | −2.52224E+03 | 3.86688E+03 | 4.09123E+02 | 8.74275E+02 | −3.82882E+03 | 8.01353E+02 |
| KX | 5.25996E+00 | 9.94268E+00 | 2.47012E+00 | 5.41930E−01 | −1.00015E+01 | −7.59055E−01 |
| X0Y1 | −1.08808E−03 | 1.57794E−04 | −7.13982E−03 | −8.91748E−04 | −4.44683E−03 | 1.01284E−03 |
| X2Y0 | −3.86147E−06 | 2.14683E−05 | 6.14992E−05 | −1.22516E−05 | −2.28591E−05 | −2.08182E−06 |
| X0Y2 | 9.60470E−06 | −1.11887E−05 | 9.14338E−05 | 1.87304E−05 | −4.96512E−05 | −1.76079E−05 |
| X2Y1 | 4.06148E−08 | 1.34891E−07 | 2.51556E−06 | −2.64374E−09 | 4.45517E−08 | −4.57929E−08 |
| X0Y3 | −1.46240E−08 | −2.88055E−08 | 1.01309E−06 | −1.75323E−08 | 8.67445E−08 | −2.33849E−08 |
| X4Y0 | 3.66572E−11 | −4.14182E−11 | −3.71365E−09 | −1.12607E−10 | 6.83811E−10 | 2.63789E−10 |
| X2Y2 | −2.94324E−11 | −1.43005E−10 | −1.01575E−08 | −2.27603E−10 | 1.09709E−09 | 5.07542E−10 |
| X0Y4 | −8.77834E−11 | −1.83980E−10 | −4.47181E−08 | −1.21912E−10 | 1.55097E−09 | 3.60040E−10 |
| X4Y1 | 1.23924E−14 | 4.13040E−14 | 6.01369E−11 | −5.23281E−15 | 1.04874E−13 | −2.86217E−14 |
| X2Y3 | 5.82928E−15 | 2.66493E−14 | 3.71081E−11 | −1.76964E−14 | −6.31557E−13 | −4.07139E−14 |
| X0Y5 | 2.95191E−15 | −1.95981E−14 | 1.07418E−10 | −9.55623E−15 | 4.47833E−13 | 7.47444E−14 |
| X6Y0 | 2.05588E−17 | −2.69756E−17 | −7.53168E−14 | −1.87027E−16 | 1.69777E−15 | 3.81271E−16 |
| X4Y2 | −3.83987E−17 | −1.19210E−16 | −2.66001E−13 | −5.86260E−16 | 4.14315E−15 | 1.08062E−15 |
| X2Y4 | −1.60693E−17 | −4.60703E−17 | −7.74516E−13 | −6.22358E−16 | 4.65890E−15 | 1.21911E−15 |
| X0Y6 | 3.56541E−17 | −7.04445E−17 | −1.82021E−13 | −2.08124E−16 | 1.45566E−15 | 2.70979E−16 |
| X6Y1 | −7.32962E−21 | −6.28988E−20 | −4.26209E−16 | −1.80362E−20 | −4.07824E−18 | −1.35447E−19 |
| X4Y3 | 1.46379E−21 | −7.10111E−20 | −2.75289E−16 | −1.39040E−20 | −4.40794E−18 | −2.16340E−19 |

TABLE 2-continued (Free form coefficients in relation to FIG. 1)

| Surface | 1 | 2 | 3 | 4 | 5 | 6 |
|---|---|---|---|---|---|---|
| X2 Y5 | −8.35635E−20 | −5.95494E−19 | −1.78680E−15 | 9.88641E−22 | −3.03231E−18 | −1.60069E−19 |
| X0 Y7 | 2.85220E−19 | 5.22473E−19 | −5.75963E−15 | 9.18598E−21 | 2.01518E−18 | −1.37106E−19 |
| X8 Y0 | 1.48560E−23 | 1.58605E−23 | −1.59206E−18 | −2.57200E−22 | 4.44205E−21 | 4.79793E−22 |
| X6 Y2 | −4.60568E−23 | −1.30430E−22 | −7.10251E−18 | −1.06246E−21 | 1.65614E−20 | 1.87709E−21 |
| X4 Y4 | −4.11952E−23 | −2.50319E−22 | −2.39859E−18 | −1.69969E−21 | 1.25399E−20 | 2.65450E−21 |
| X2 Y6 | −4.02636E−22 | −3.72803E−21 | −2.03854E−17 | −1.23683E−21 | 1.60168E−21 | 1.23598E−21 |
| X0 Y8 | −3.98310E−22 | −9.46200E−22 | 2.69545E−18 | −3.69694E−22 | −5.61722E−21 | 7.95456E−22 |
| X8 Y1 | 3.80040E−26 | 5.86524E−25 | −2.46663E−21 | −1.15590E−26 | −4.25390E−24 | −2.88428E−25 |
| X6 Y3 | 3.18975E−26 | 9.32086E−25 | −4.67856E−21 | −2.95251E−26 | −2.09720E−23 | −1.11904E−24 |
| X4 Y5 | 1.27447E−25 | 2.83287E−24 | −2.20519E−20 | 1.32427E−25 | −8.12734E−24 | −1.11582E−24 |
| X2 Y7 | 8.50855E−25 | 4.66290E−24 | 8.85362E−20 | 4.82014E−25 | 2.32661E−23 | −2.54238E−25 |
| X0 Y9 | −2.99681E−24 | −5.34256E−24 | 1.54202E−19 | 7.96968E−25 | −1.81694E−23 | −1.31245E−25 |
| X10 Y0 | −2.84491E−31 | −3.22166E−28 | −8.28334E−23 | −7.15383E−28 | 2.64433E−26 | 1.47979E−27 |
| X8 Y2 | −2.97058E−29 | −5.71985E−28 | −4.63265E−22 | −3.89365E−27 | 1.06969E−25 | 7.28986E−27 |
| X6 Y4 | −2.04204E−28 | −2.16623E−27 | −1.96205E−21 | −8.64329E−27 | 3.31436E−25 | 1.53599E−26 |
| X4 Y6 | 1.25272E−28 | −4.35733E−27 | −2.85532E−21 | −9.37598E−27 | 1.98503E−25 | 1.51858E−26 |
| X2 Y8 | −3.85041E−30 | 1.26195E−26 | −2.21651E−21 | −4.96260E−27 | 8.87219E−26 | 9.49903E−27 |
| X0 Y10 | 4.98929E−27 | 8.65741E−27 | −1.75492E−21 | −2.85779E−27 | 1.88543E−25 | 1.98480E−27 |

What is claimed is:

1. An optical arrangement, compriseing:
a first mirror; and
a second mirror rigidly connected to the first mirror,
wherein:
during use, light travels through the optical arrangement along a path;
the first and second mirrors are in direct succession to each other along the path;
the first mirror has a through hole along the path;
the second mirror has a through hole along the path;
the optical arrangement has a lowest natural frequency which is 20% greater than a lowest natural frequency of a corresponding optical arrangement without a rigid connection between the first and second mirrors; and
the optical arrangement is configured to be used in a microlithographic EUV projection objective.

2. The optical arrangement of claim 1, wherein the first and second mirrors are in a monolithic configuration.

3. The optical arrangement of claim 1, further comprising a ring that connects the first and second mirrors.

4. The optical arrangement of claim 3, wherein the first mirror, the second mirror and the ring comprise the same material.

5. The optical arrangement of claim 3, wherein the ring comprises a glass ceramic material.

6. The optical arrangement of claim 3, wherein the ring has an opening.

7. The optical arrangement of claim 1, wherein the light has a wavelength of less than 15nm.

8. An objective comprising an optical arrangement of claim 1, wherein the objective is a microlithographic EUV projection objective.

9. The projection objective of claim 8, wherein:
the projection objective is configured to image an object plane into an image plane; and
one of the following holds:
the second mirror is geometrically disposed in the last position at an image plane side of the projection objective; or
the second mirror is geometrically disposed at a smallest spacing relative to the image plane.

10. The projection objective of claim 8, wherein the projection objective has a numerical aperture of at least 0.3.

11. An apparatus, comprising:
an illumination system; and
a projection objective comprising the optical arrangement of claim 1,
wherein the apparatus is a microlithographic EUV projection exposure apparatus.

12. An optical arrangement, comprising:
a first mirror; and
a second mirror rigidly connected to the first mirror,
wherein:
during use, light travels through the optical arrangement along a path;
the first and second mirrors are in direct succession to each other along the path;
the optical arrangement has a lowest natural frequency which is 20% greater than a lowest natural frequency of a corresponding optical arrangement without a rigid connection between the first and second mirrors; and
the optical arrangement is configured to be used in a microlithographic EUV projection objective.

13. An optical arrangement, comprising:
a first mirror; and
a second mirror rigidly connected to the first mirror,
wherein:
during use, light travels through the optical arrangement along a path;
the first and second mirrors are in direct succession to each other along the path;
the optical arrangement has a natural frequency of at least 1200 Hz; and
the optical arrangement is configured to be used in a microlithographic EUV projection objective.

14. An optical arrangement, comprising:
a first mirror; and
a second mirror rigidly connected to the first mirror,
wherein:
during use, light travels through the optical arrangement along a path;
the first and second mirrors are in direct succession to each other along the path;
the optical arrangement has an area moment of inertia which is 40% greater than an area moment of inertia of a corresponding optical arrangement without a rigid connection between the first and second mirrors; and the optical arrangement is configured to be used in a microlithographic EUV projection objective.

15. An optical arrangement, comprising:
a first mirror; and
a second mirror, the second mirror having a ratio of maximum diameter to maximum thickness of at least 10,
wherein a natural frequency of the optical arrangement is at least 1200Hz, and the optical arrangement is configured to be used in a microlithographic EUV projection objective.

16. An optical arrangement, comprising:
a first mirror; and
a second mirror rigidly connected to the first mirror,
wherein:
  during use, light travels through the optical arrangement along a path;
  the first and second mirrors are in direct succession to each other along the path;
  the first mirror has a through hole along the path;
  the second mirror has a through hole along the path;
  the optical arrangement has a natural frequency of at least 1200Hz; and
  the optical arrangement is configured to be used in a microlithographic EUV projection objective.

17. An optical arrangement, comprising:
a first mirror; and
a second mirror rigidly connected to the first mirror,
wherein:
  during use, light travels through the optical arrangement along a path;
  the first and second mirrors are in direct succession to each other along the path;
  the first mirror has a through hole along the path;
  the second mirror has a through hole along the path;
  the optical arrangement has an area moment of inertia which is 40 % greater than an area moment of inertia of a corresponding optical arrangement without a rigid connection between the first and second mirrors; and
  the optical arrangement is configured to be used in a microlithographic EUV projection objective.

* * * * *

UNITED STATES PATENT AND TRADEMARK OFFICE
CERTIFICATE OF CORRECTION

PATENT NO. : 9,086,561 B2
APPLICATION NO. : 13/235651
DATED : July 21, 2015
INVENTOR(S) : Hans-Juergen Rostalski, Tilman Schwertner and Alexander Epple It is certified that error appears in the above-identified patent and that said Letters Patent is hereby corrected as shown below:

In the Claims

Col. 9, line 24, Claim 1, delete "compriseing:" and insert -- comprising: --.

Col. 9, line 53, Claim 7, delete "15nm." and insert -- 15 nm. --.

Col. 11, line 8, Claim 15, delete "1200Hz," and insert -- 1200 Hz, --.

Col. 11, line 21, Claim 16, delete "1200Hz;" and insert -- 1200 Hz; --.

Signed and Sealed this
Twenty-first Day of June, 2016

Michelle K. Lee
*Director of the United States Patent and Trademark Office*